United States Patent
Ortet

(10) Patent No.: US 8,576,577 B2
(45) Date of Patent: Nov. 5, 2013

(54) AVIONIC EQUIPMENT ITEM

(75) Inventor: Stephane Ortet, Mondonville (FR)

(73) Assignee: Airbus Operations SAS, Toulouse (FR)

( * ) Notice: Subject to any disclaimer, the term of this patent is extended or adjusted under 35 U.S.C. 154(b) by 149 days.

(21) Appl. No.: 12/665,139

(22) PCT Filed: May 29, 2008

(86) PCT No.: PCT/FR2008/050945
§ 371 (c)(1), (2), (4) Date: Dec. 17, 2009

(87) PCT Pub. No.: WO2008/155498
PCT Pub. Date: Dec. 24, 2008

(65) Prior Publication Data
US 2010/0188831 A1  Jul. 29, 2010

(30) Foreign Application Priority Data
Jun. 21, 2007 (FR) .................................. 07 55921

(51) Int. Cl.
*H05K 7/14* (2006.01)
(52) U.S. Cl.
USPC ............ 361/788; 361/796; 361/801; 361/802
(58) Field of Classification Search
USPC ......... 361/725, 753, 759, 758, 801, 792, 788, 361/740
See application file for complete search history.

(56) References Cited

U.S. PATENT DOCUMENTS

| | | | |
|---|---|---|---|
| 4,131,933 A | 12/1978 | Agard et al. | |
| 5,234,348 A | 8/1993 | Konsevich et al. | |
| 5,348,482 A * | 9/1994 | Rudy et al. | 439/61 |
| 6,350,130 B1 | 2/2002 | Eller | |
| 6,394,815 B1 | 5/2002 | Sarno et al. | |
| 6,512,676 B1 | 1/2003 | Crapisi et al. | |
| 7,128,616 B1 * | 10/2006 | Orr et al. | 439/651 |
| 7,180,751 B1 | 2/2007 | Geschke et al. | |
| 2003/0038096 A1 | 2/2003 | Crapisi et al. | |

FOREIGN PATENT DOCUMENTS

| | | |
|---|---|---|
| FR | 2 783 392 | 3/2000 |
| RU | 43 428 U1 | 1/2005 |

OTHER PUBLICATIONS

Russian Decision to Grant Issued Jan. 30, 2013 in Patent Application No. 2010101800/07 (French translation).

Mikhail Berdichevsky, "Eurocard architecture in embedded systems", Technologie modern d'automation, No. 4, 2002, pp. 52-55 (with English abstract).

(Continued)

Primary Examiner — Jayprakash N Gandhi
Assistant Examiner — Hung Dang
(74) Attorney, Agent, or Firm — Oblon, Spivak, McClelland, Maier & Neustadt, L.L.P.

(57) ABSTRACT

The invention relates to avionics equipment including a motherboard (108), at least one daughterboard (150) and, for each daughterboard, two supporting slides (116) attached directly to the motherboard and bearing the daughterboard. The invention also includes at least one mechanical connecting part (122A to 122D, 128A, 128B) between the motherboard (108) and at least one of the following: a backplane board (112) connected to an avionic connector (124), an avionic connector (124) and the rear face (106) of the avionics equipment.

6 Claims, 4 Drawing Sheets

(56) References Cited

OTHER PUBLICATIONS

Figure 1:
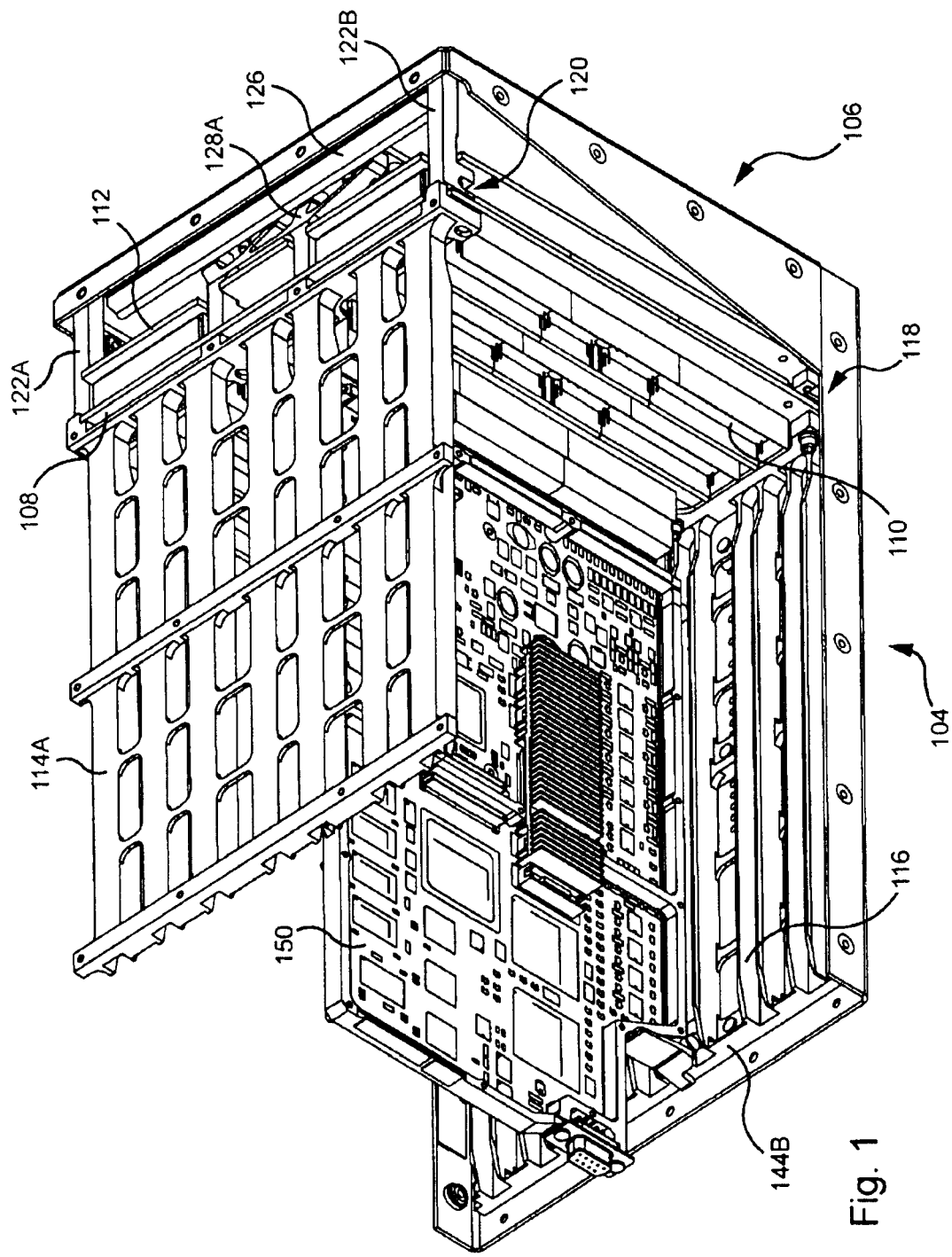

Igor Babanov, "Compact PCI—the future of industrial computers", PC Week, http://www.pcweek.ru/themes/detail.oho?ID=447328,sphrase id=5836, vol. 122, No. 48, Dec. 8, 1997, 5 pages (with English abstract).

Office Action issued Dec. 11, 2012, in Japanese Patent Application No. 2010-512743 (submitting English translation only).

* cited by examiner

AVIONIC EQUIPMENT ITEM

This invention relates to an avionic equipment item. It applies, in particular, to on-board computers.

During the development of on-board computers intended for large-sized aircraft, the vibration stresses are particularly significant.

The assembly of the backplane boards is accomplished in certain applications, for example ARINC 600, by simple cross-pieces that connect the motherboard to the backplane board and that connect the backplane set to the rear face of the equipment item.

There are two major families of solutions for designing an equipment item comprising a motherboard and daughterboards in one housing. In the first, non-lockable slides are implemented: a daughterboard slides in a guide connected to the housing and it is immobilized in part by the holding force of the contacts of the motherboard connectors and, possibly, by holding elements on the front face (foam rubber, screw, . . . ). These solutions are suitable for not very stressing vibratory environments.

In the second family of solutions, locking slides are implemented: the board slides in a guide connected to the housing and is immobilized by a mechanical system that joins it together with the housing. These solutions are suitable for more stressing vibratory environments. However, since these boards are rigidly attached at the upper and lower part of the equipment item, under vibration the stresses generated by the mass of the boards pass through the outer wall of the equipment item to be "taken up" by the "Arinc" (acronym for "Aeronautical Radio, Incorporated," trademark) connector that provides the fastening of the equipment item onto the airplane. Since the walls are not extremely rigid, the entire rear zone of the equipment item becomes deformed (in particular the rear face), which creates a relative movement between the block consisting of the electronic boards and the backplane. To these drawbacks are added the significant deformations within the backplane itself.

Now, the connectors, which are the elements that provide the electrical connection between the sub-sets, are sensitive to these deformations. Since the sub-sets move in relative manner between themselves, micro-movements are created between the male and female parts of the connectors, which leads to risks of wear and tear, known under the name of "Fretting corrosion."

The conventional manner of resolving these problems is to use the connections robust under vibration. These connections, borrowed from the military market, originating from a restricted market, are very costly.

This invention seeks to remedy these drawbacks and, in particular, to limit the relative movement between the daughterboards and the motherboard and to limit the deformation of the rear part of the equipment.

To this end, this invention applies to an avionic equipment item comprising a motherboard, at least one daughterboard and, for each daughterboard, two supports in the form of a slide fastened directly onto the motherboard and supporting the said daughterboard.

By virtue of these arrangements, the relative movements at the connectors between the motherboard and each daughterboard are reduced. According to specific characteristics, the avionic equipment item such as briefly described comprises two mechanical parts, upper and lower, respectively, each comprising one of the supports in the form of a slide for each daughterboard.

By virtue of these arrangements, the rigidity of the assembly also is reinforced.

According to specific characteristics, the avionic equipment item such as briefly described above comprises at least one mechanical connecting part between the motherboard and a backplane board connected to an avionic connector. It is noted that this avionic connector generally is known under the name of "Arinc" connector.

According to specific characteristics, at least one mechanical connecting part between the motherboard and a backplane board furthermore comprises fastening means for the rear face of the avionic equipment item.

According to specific characteristics, at least one mechanical connecting part between the motherboard and a backplane board furthermore comprises fastening means for the avionic connector.

According to specific characteristics, at least one mechanical connecting part between the motherboard and a backplane board furthermore comprises fastening means for the rear face of the avionic equipment item and fastening means for the avionic connector.

According to specific characteristics, the avionic equipment item such as briefly explained above comprises at least one mechanical connecting part between the motherboard and the avionic connector.

According to specific characteristics, at least one mechanical connecting part between the motherboard and the avionic connector furthermore comprises fastening means for the rear face of the avionic equipment item.

According to specific characteristics, the avionic equipment item such as briefly explained above comprises at least one mechanical connecting part between the motherboard and the rear face of the avionic equipment item.

By virtue of each of these arrangements, the movements in the backplane zone are considerably reduced.

Figure 2:
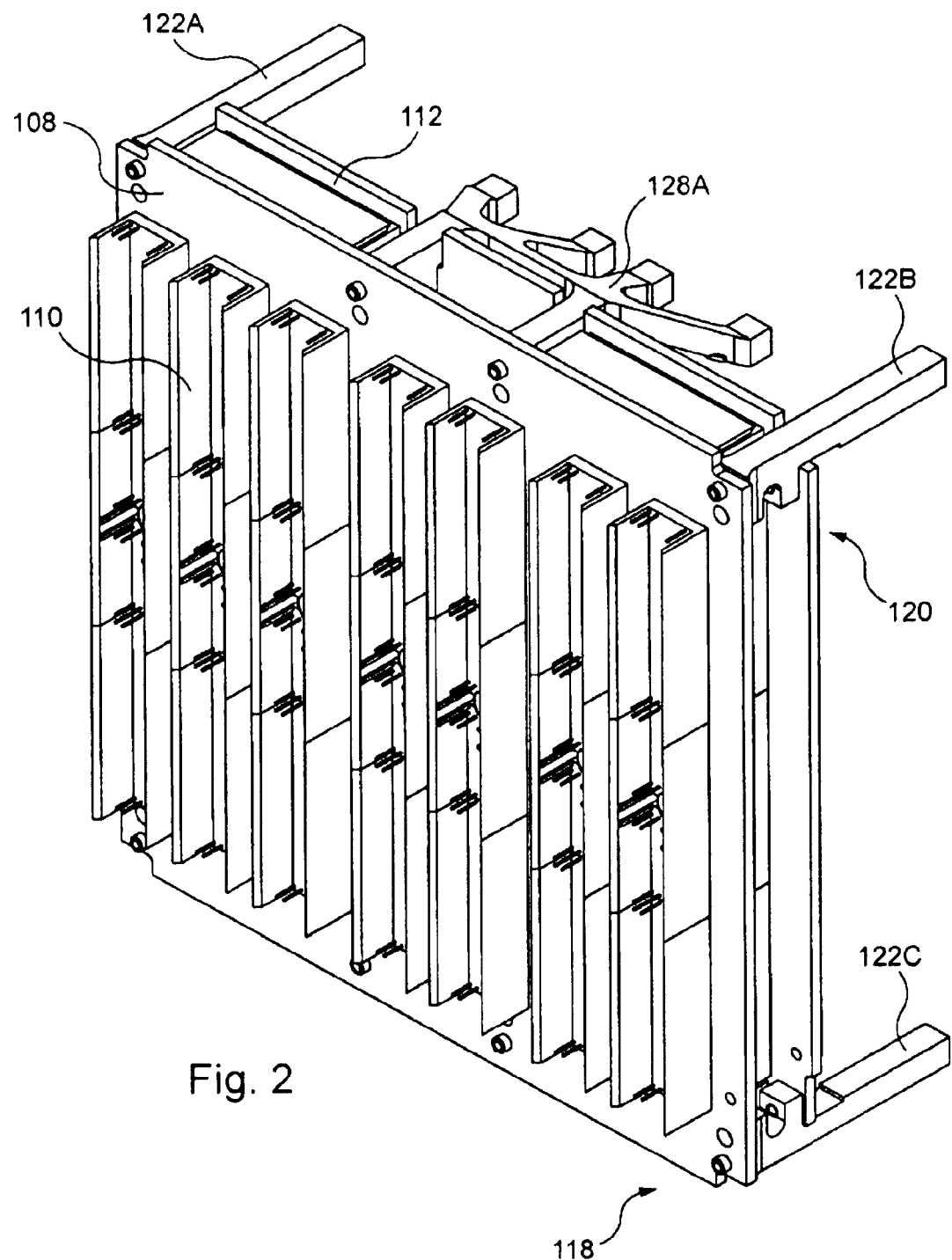
Figure 3:
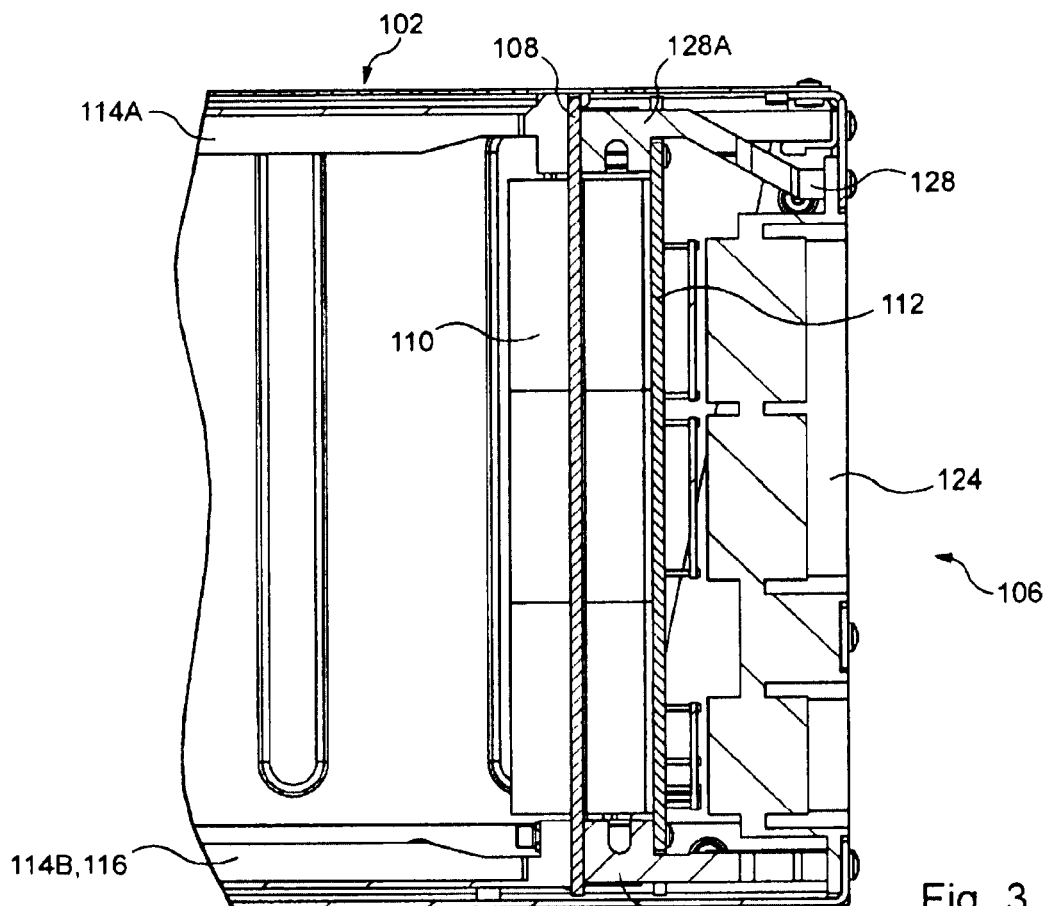
Figure 4:
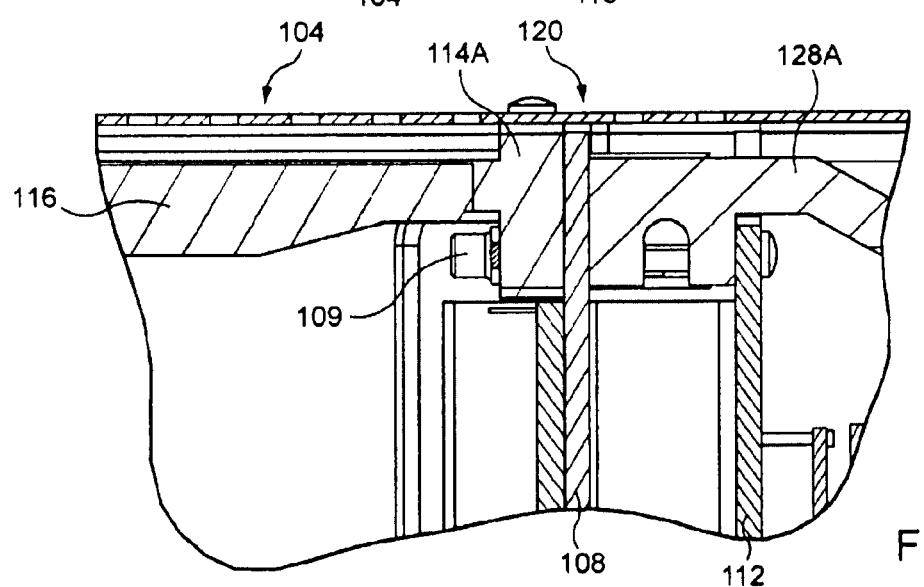
Figure 5A:
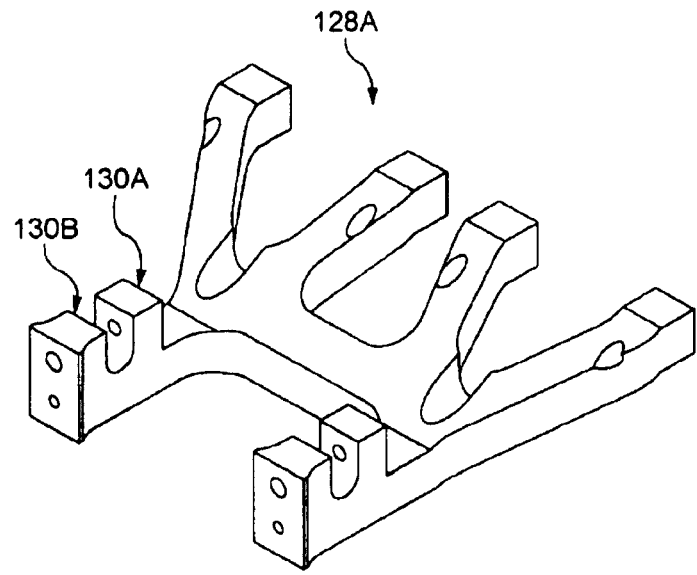
Figure 5B:
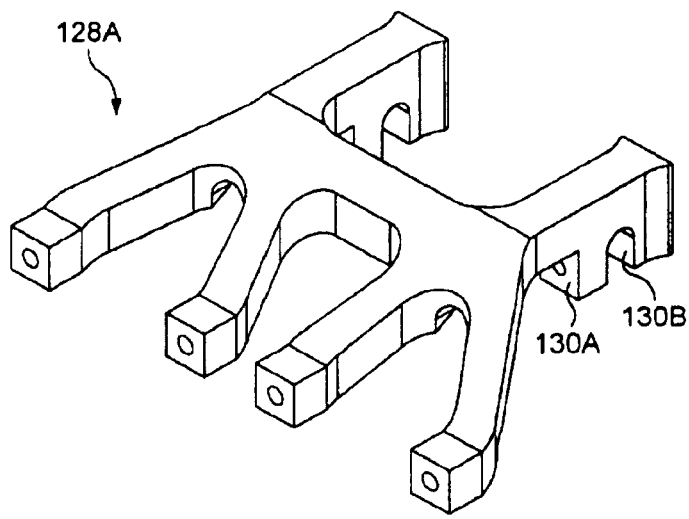
Figure 6:
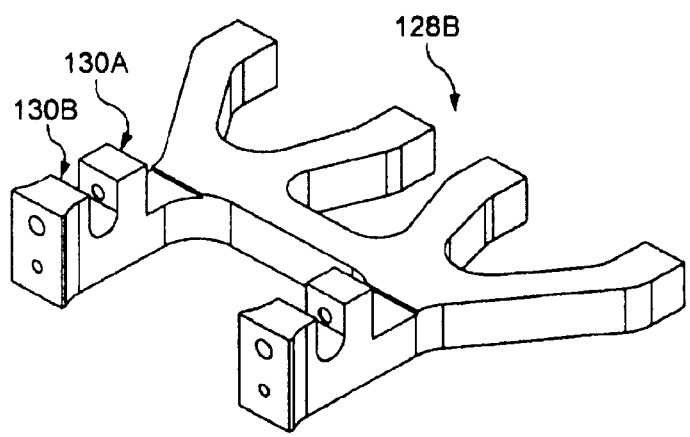

Other advantages, purposes and characteristics of this invention will become apparent from the description that is going to follow, presented with an explanatory and in no way limitative intent, with reference to the attached drawings, in which:

FIG. 1 shows, in perspective, a specific embodiment of the avionic equipment item that is an object of this invention, FIG. 2 shows, in perspective, a detail of the specific embodiment of the avionic equipment item illustrated in FIG. 1, FIG. 3 shows, in section, the avionic equipment item illustrated in FIG. 1, FIG. 4 shows, enlarged, a portion of the avionic equipment item of FIGS. 1 to 3, FIGS. 5A and 5B show, in perspective, according to two views with opposite orientations, a specific form of implementation of an upper fastening means of the specific embodiment of FIGS. 1 to 4 and FIG. 6 shows, in perspective, a specific form of implementation of a lower fastening means of the specific embodiment of FIGS. 1 to 4.

There is seen in the Figures an avionic equipment item 102 comprising a lower face 104, a rear face 106, a motherboard 108, locations 110 for seven daughterboards 150 (only one being shown in FIG. 1) and a backplane board 112 connected to an avionic connector 124.

For the purpose of clarity, the other faces of avionic equipment item 102, that is, the side, rear and upper faces, are not shown in the Figures.

There also is seen in the Figures a lower slide support 114B for daughterboards 150 comprising, for each daughterboard, a slide 116, a support zone forming a "U" that accommodates daughterboard 150 and, possibly, a board frame that supports the locking slide (a complex mechanical part that expands) that performs a blocking function.

As is seen more precisely with reference to FIG. 4, support 114B is fastened directly onto lower part 118 of motherboard 108 and is adapted for supporting each of daughterboards 150 of avionic equipment item 102.

For the purpose of clarity, there has not been shown in FIGS. 2 and 3 an upper support 114A, symmetrical with lower support 114B, this upper support 114A being connected to top part 120 of motherboard 108 in the same manner as support 114B. This upper support 114A itself also comprises a slide 116 for each daughterboard 150. Thus upper support 114A is adapted for supporting each of the daughterboards of avionic equipment item 102.

In the embodiment illustrated in the Figures, there thus are only two supports, upper and lower respectively, that each comprise one of holding slides 116 for each daughterboard. In variants, several upper supports and several lower supports, all fastened directly onto motherboard 108, each comprise at least one daughterboard-holding slide 116.

There are seen in FIGS. 1 and 2, respectively two and three mechanical connecting parts 122A to 122C between motherboard 108 and backplane board 112. A fourth mechanical connecting part 122D is located at lower part 118 of motherboard 108 but is not visible in the Figures. In the Figures, these mechanical connecting parts 122A to 122D take the form of straight cross-pieces. These mechanical connecting parts 122A to 122D furthermore comprise fastening means at rear face 106 of avionic equipment item 102.

There also is seen in FIG. 1 a reinforcement 126 for rear face 106, elongated horizontally on the inner surface of rear face 106, at the top part and with an "L"-shaped section.

There are seen in the Figures upper fastening means 128A and lower fastening means 128B for avionic connector 124. In the Figures, these fastening means 128A and 128B, illustrated in FIGS. 5A, 5B and 6, take the form of bent cross-pieces.

Preferentially, fastening means 128A and 128B each are a single piece that forms the connection between the following elements: the motherboard, the second backplane board, the Arinc avionic connector (as a priority because it is the connection with the airplane) and the rear face.

Also preferentially, as in the embodiments illustrated in the Figures, the same mechanical parts 122A to 122D ensure the connection between the motherboard and the backplane board, the connection of the motherboard with the rear face of the avionic equipment item, the connection of the backplane board with the rear face of the avionic equipment item. In other embodiments, however, these various functions are provided by several different mechanical parts, according to the various possible combinations of these functions and/or these parts furthermore ensure the function of avionic connector fastening.

As illustrated in FIG. 3, lower support 114B is aligned with each lower cross-piece 122C and 122D and with lower fastening means 128B, lower part 118 of motherboard 108 being held between support 114B on the one hand, and lower cross-pieces 122C and 122D and lower fastening means 128B on the other hand, by bolts 109. It is noted that upper support 114A has not been shown in FIG. 3.

As illustrated in FIG. 4, upper support 114A is aligned with each upper cross-piece 122A and 122B and with upper fastening means 128A, top part 120 of motherboard 108 being held between support 114A on the one hand, and upper cross-pieces 122A and 122B and upper fastening means 128A on the other hand, by bolts 109.

Moreover, as illustrated in FIGS. 4, 5A, 5B and 6, upper and lower cross-pieces 122A to 122D and fastening means 128A and 128B comprise flat surfaces 130A and 130B perpendicular to the main elongation of these pieces, in order to support on the one hand motherboard 108, as explained above, and on the other hand backplane board 112, each bolt 109 going through these two boards 108 and 112 and, between them, two parts of fastening means 128.

As is understood upon reading the above description, the implementation of this invention allows the use of "industrial" connections effective in terms of withstanding vibrations, in terms of point density and in terms of cost. It makes it possible to limit the relative movement between the daughterboards and the motherboard. It also makes it possible to limit the deformation of the rear part of the equipment item by rigidifying the connection between the motherboard and the backplane board as well as the connection between this set and the Arinc avionic connector.

In particular, the direct assembly of the daughterboard supports in the form of a slide on the motherboard considerably limits the relative movements of the daughterboard/motherboard connections.

The invention claimed is:

1. An avionic equipment item, comprising:
    a motherboard;
    a rear face;
    at least one daughterboard and for each daughterboard, two supports in a form of a slide fastened directly onto the motherboard and supporting the daughterboard;
    a backplane board connected to an avionic connector; and
    at least one mechanical connecting part between the motherboard and the backplane board and the avionic connector wherein the at least one mechanical connecting part between the motherboard and the backplane board includes first fastening means including two parallel structures, each parallel structure including a u-shaped slot, and is configured to attach to the backplane board and to the motherboard, and second fastening means including four bent cross-pieces configured to attach to the avionic connector.

2. The avionic equipment item according to claim 1, wherein the at least one mechanical connecting part is configured to accept at least one bolt.

3. The avionic equipment item according to claim 1, wherein the second and third fastening means protrude from the at least one mechanical connecting part in a direction perpendicular to a main elongation direction to the at least one mechanical connecting part.

4. The avionic equipment item according to claim 1, wherein the second and third fastening means are configured to accept a bolt.

5. The avionic equipment item according to claim 4, wherein the bolt goes through the motherboard and the backplane board.

6. The avionic equipment item according to claim 1, wherein the first fastening means connects both the rear face and the avionic connector.

* * * * *